(12) United States Patent
Chen et al.

(10) Patent No.: US 8,288,759 B2
(45) Date of Patent: Oct. 16, 2012

(54) VERTICAL STACKING OF CARBON NANOTUBE ARRAYS FOR CURRENT ENHANCEMENT AND CONTROL

(76) Inventors: Zhihong Chen, Valhalla, NY (US); Aaron Daniel Franklin, Croton on Hudson, NY (US); Shu-Jen Han, Wappingers Falls, NY (US)

( * ) Notice: Subject to any disclaimer, the term of this patent is extended or adjusted under 35 U.S.C. 154(b) by 248 days.

(21) Appl. No.: 12/850,095

(22) Filed: Aug. 4, 2010

(65) Prior Publication Data

US 2012/0032149 A1 Feb. 9, 2012

(51) Int. Cl.
*H01L 29/06* (2006.01)
(52) U.S. Cl. ............... 257/24; 257/365; 257/E51.04; 257/E29.264; 257/E21.421; 438/283; 977/742; 977/938
(58) Field of Classification Search ............ 257/24, 257/365, E51.04, E29.264, E21.421; 438/283; 977/742, 938
See application file for complete search history.

(56) References Cited

U.S. PATENT DOCUMENTS

| | | | | |
|---|---|---|---|---|
| 6,815,294 B2 * | 11/2004 | Choi et al. | ...... | 438/268 |
| 6,933,222 B2 * | 8/2005 | Dubin et al. | ...... | 438/614 |
| 7,345,296 B2 * | 3/2008 | Tombler et al. | ...... | 257/9 |
| 7,608,905 B2 * | 10/2009 | Bratkovski et al. | ...... | 257/461 |
| 8,053,767 B2 * | 11/2011 | Lee et al. | ...... | 257/40 |
| 2008/0157354 A1 * | 7/2008 | Zhang et al. | ...... | 257/734 |
| 2008/0272361 A1 * | 11/2008 | Lim | ...... | 257/9 |
| 2009/0166686 A1 * | 7/2009 | Hunt et al. | ...... | 257/288 |

OTHER PUBLICATIONS

Q. Cao, et al., "Medium-Scale Carbon Nanotube Thin-Film Integrated Circuits on Flexible Plastic Substrates," Nature, vol. 454, pp. 495-502 (2008).
A. Raychowdhury, et al., "Variation Tolerance in a Multichannel Carbon-Nanotube Transistor for High-Speed Digital Circuits," IEEE TED, vol. 56, pp. 383-392 (2009).
K. Ryu, et al., "CMOS-Analogous Wafer-Scale Nanotube-on-Insulator Approach for Submicrometer Devices and Integrated Circuits Using Aligned Nanotubes," Nano Lett., vol. 9, pp. 189-197 (2009).
Seidel et al., "High-Current Nanotube Transistors," Nano Letters, vol. 4, No. 5, pp. 831-834 (2004).

* cited by examiner

*Primary Examiner* — Tu-Tu Ho
(74) *Attorney, Agent, or Firm* — Vazken Alexanian; Michael J. Chang, LLC

(57) ABSTRACT

Transistor devices having vertically stacked carbon nanotube channels and techniques for the fabrication thereof are provided. In one aspect, a transistor device is provided. The transistor device includes a substrate; a bottom gate embedded in the substrate with a top surface of the bottom gate being substantially coplanar with a surface of the substrate; a stack of device layers on the substrate over the bottom gate, wherein each of the device layers in the stack includes a first dielectric, a carbon nanotube channel on the first dielectric, a second dielectric on the carbon nanotube channel and a top gate on the second dielectric; and source and drain contacts that interconnect the carbon nanotube channels in parallel. A method of fabricating a transistor device is also provided.

19 Claims, 4 Drawing Sheets

VERTICAL STACKING OF CARBON NANOTUBE ARRAYS FOR CURRENT ENHANCEMENT AND CONTROL

FIELD OF THE INVENTION

The present invention relates to transistor devices, and more particularly, to transistor devices having vertically stacked carbon nanotube channels and techniques for the fabrication thereof.

BACKGROUND OF THE INVENTION

Semiconducting carbon nanotubes can conduct exceptionally high currents for their nanoscale diameter (i.e., diameters of from about 1 nanometer (nm) to about 2 nm). However, in spite of carbon nanotubes' high current density (up to $10^9$ Amps per square centimeter ($A/cm^2$)), their small size still limits carbon nanotubes to carrying tens of microamps each.

In the context of using carbon nanotubes to replace silicon as an active channel material for next-generation transistors, the achievable current from a carbon nanotubes-based device must be comparable to silicon technology (about 1 milliamp per micrometer ($mA/\mu m$)). Difficulty in controllably fabricating closely packed, parallel (aligned) carbon nanotube arrays has kept the achievable current around $0.02$ $mA/\mu m$. See, for example, K. Ryu, et al., "CMOS-Analogous Wafer-Scale Nanotube-on-Insulator Approach for Submicrometer Devices and Integrated Circuits Using Aligned Nanotubes," Nano Lett., vol. 9, pp. 189-197 (2009).

Reports suggest that in order to obtain 1 $mA/\mu m$ from aligned carbon nanotubes, the pitch from nanotube to nanotube would have to be near 10 nm, which is an order of magnitude smaller than the best reproducibly obtained density to date. See, for example, A. Raychowdhury, et al., "Variation Tolerance in a Multichannel Carbon-Nanotube Transistor for High-Speed Digital Circuits," IEEE TED, vol. 56, pp. 383-392 (2009). Another alternative is the use of random carbon nanotube networks known as thin-film transistors, but the current in these systems becomes even more limited by percolation and/or poor carbon nanotube-metal contacts from bundling. See, for example, Q. Cao, et al., "Medium-Scale Carbon Nanotube Thin-Film Integrated Circuits on Flexible Plastic Substrates," Nature, vol. 454, pp. 495-502 (2008).

Therefore, techniques for increasing the current carrying capacity of carbon nanotube-based devices would be desirable.

SUMMARY OF THE INVENTION

The present invention provides transistor devices having vertically stacked carbon nanotube channels and techniques for the fabrication thereof. In one aspect of the invention, a transistor device is provided. The transistor device includes a substrate; a bottom gate embedded in the substrate with a top surface of the bottom gate being substantially coplanar with a surface of the substrate; a stack of device layers on the substrate over the bottom gate, wherein each of the device layers in the stack includes a first dielectric, a carbon nanotube channel on the first dielectric, a second dielectric on the carbon nanotube channel and a top gate on the second dielectric; and source and drain contacts that interconnect the carbon nanotube channels in parallel.

In another aspect of the invention, a method of fabricating a transistor device is provided. The method includes the following steps. A substrate is provided. A bottom gate is formed embedded in the substrate with a top surface of the bottom gate being substantially coplanar with a surface of the substrate. A stack of device layers is formed on the substrate over the bottom gate. Each of the device layers in the stack includes a first dielectric, a carbon nanotube channel on the first dielectric, a second dielectric on the carbon nanotube channel and a top gate on the second dielectric. Source and drain contacts are formed that interconnect the carbon nanotube channels in parallel.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for obtaining a desired current in carbon nanotube transistors by vertically stacking carbon nanotube arrays. FIGS. 1-10, for example are diagrams illustrating an exemplary methodology for fabricating a transistor device having vertically stacked carbon nanotube arrays. In general, a transistor includes a source and a drain connected by a channel(s), and a gate which regulates electron flow through the channel(s). As will be described in detail below, with the present techniques, a vertical stacking configuration for the carbon nanotube arrays (which serve as channels of the device) is employed, with the number of carbon nanotube arrays in the stack being tailored to provide the desired current.

Figure 1:
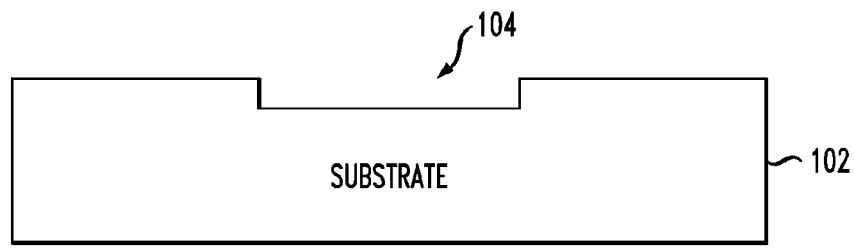
FIG. 1 is a cross-sectional diagram illustrating a substrate on which a transistor device will be fabricated according to an embodiment of the present invention.

Specifically, FIG. 1 is a cross-sectional diagram illustrating a substrate 102 on which the device will be fabricated. Suitable substrates include, but are not limited to, a silicon substrate covered with a layer of silicon dioxide (into which the bottom gate will be formed, as described below) and quartz. As shown in FIG. 1, a trench 104 has been formed (patterned) in substrate 102. Trench 104 marks the footprint and location of a local bottom gate to be formed as described below. According to an exemplary embodiment, trench 104 is formed using an anisotropic dry etch (e.g., reactive ion etching (RIE)) followed by a wet chemical etch to undercut trench 104 through a positive resist (e.g., poly (methyl methacrylate) (PMMA)). The undercutting of trench 104 is done to prevent the build-up of gate material that is to be deposited in the next step, thus providing a smooth surface on which to build the device.

Figure 2:
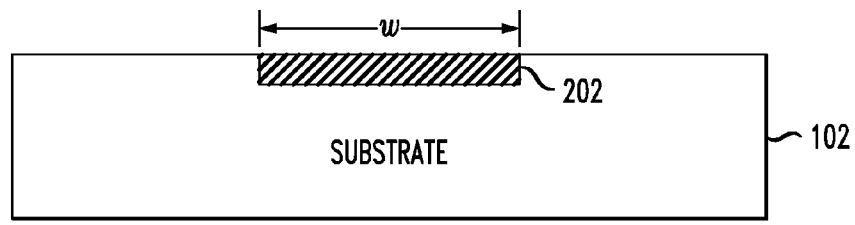
FIG. 2 is a cross-sectional diagram illustrating a bottom gate having been formed in a trench patterned in the substrate according to an embodiment of the present invention.

FIG. 2 is a cross-sectional diagram illustrating a bottom gate 202 having been formed in trench 104. Bottom gate 202 is formed by first filling a suitable gate material into trench 104. According to one exemplary embodiment, the gate material comprises a metal or a combination of metals deposited into trench 104 using, e.g., electron beam evaporation. Any metal(s) can be used and the particular metal(s) selected may vary for p-channel and n-channel devices to tune the threshold voltage accordingly. By way of example only, suitable gate metals include, but are not limited to aluminum (Al), titanium (Ti) and/or palladium (Pd). In one example configuration, titanium is first deposited into trench 104 followed by palladium.

Alternatively, according to another exemplary embodiment, the gate material comprises poly-silicon. The poly-silicon can be doped accordingly to attain the desired work function and conductivity. The techniques for poly-silicon gate doping are known to those of skill in the art and thus are not described further herein.

The result is bottom gate 202 embedded in substrate 102. As shown in FIG. 2, a top surface of bottom gate 202 is flush with a surface of substrate 102. Since the surfaces are flush with one another, the top surface of bottom gate 202 is thus coplanar with the surface of substrate 102. The coplanar bottom gate and substrate provide a flat surface on which the device can be built.

It is notable that the dimensions of bottom gate 202 can be configured to address the specific device needs. By way of example only, a width w of the bottom gate can be varied to tune the channel length.

As highlighted above, in order to be able to use this local bottom gate configuration as a foundation on which the device can be built, the bottom gate has to be level or flush (i.e., coplanar) with the surrounding substrate which serves to keep the carbon nanotube channel (that will be formed over the gate) free of any physical distortions, such as kinks or bends, which can adversely affect carrier transport. See, for example, in FIG. 2 where it is shown that a top surface of bottom gate 202 is coplanar with the surface of substrate 102.

It is notable that, due to production tolerances, in practice the top surface of bottom gate 202 might end up being slightly higher or slightly lower than the surface of substrate 102. When the difference between the surfaces is less than or equal to about 5 nm the surfaces are considered substantially coplanar according to the present teachings. Specifically, if the top surface of bottom gate 202 is less than or equal to about 5 nanometers (nm) higher than the surface of substrate 102 then the top surface of bottom gate 202 is considered herein to be substantially coplanar with the surface of substrate 102. Similarly, if the top surface of bottom gate 202 is less than or equal to about 5 nm lower than the surface of substrate 102 then the top surface of bottom gate 202 is considered herein to be substantially coplanar with the surface of substrate 102.

A substantially coplanar bottom gate/substrate surface may be achieved in a number of different ways. One way is to deposit the metal or poly-silicon gate material so as to overfill the trench and then polish the deposited gate material, e.g., using chemical-mechanical polishing (CMP), down to the surface of the substrate. The same resist mask, e.g., PMMA, that was used to etch trench 104 can also be used to fill the gate material. Thus another way to achieve a substantially coplanar gate/substrate surface is by depositing the gate material through the PMMA resist mask so as to fill (to the top of, but not overfilling) the trench, and then use lift-off in acetone to remove the PMMA, leaving the metal gate flush with the surrounding substrate (the presence of the resist allows for the gate material to remain only in the trenches, since when the resist is removed the gate material on top of the resist washes away with it).

Figure 3:
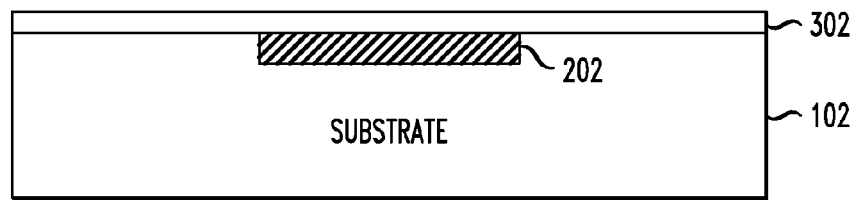
FIG. 3 is a cross-sectional diagram illustrating a first dielectric having been deposited on the substrate over the bottom gate according to an embodiment of the present invention.

A stack of device layers is then formed on the substrate over the bottom gate. As will be described in detail below, each device layer in the stack includes a first dielectric, a carbon nanotube channel and a top gate separated from the carbon nanotube channel by a second dielectric. FIG. 3, for example, is a cross-sectional diagram illustrating a dielectric 302 (which will serve as a gate dielectric of the device) having been deposited on substrate 102 over bottom gate 202. According to an exemplary embodiment, dielectric 302 comprises aluminum oxide ($Al_2O_3$) or hafnium oxide ($HfO_2$) and is deposited using a chemical vapor deposition (CVD) process such as atomic layer deposition (ALD).

Figure 4:
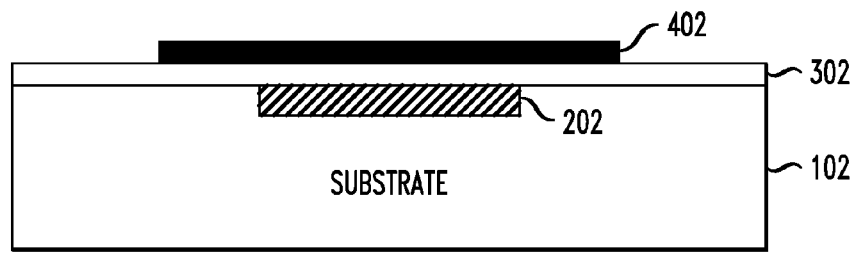
FIG. 4 is a cross-sectional diagram illustrating a carbon nanotube channel having been formed on the first dielectric over the bottom gate according to an embodiment of the present invention.

FIG. 4 is a cross-sectional diagram illustrating a carbon nanotube channel 402 having been formed on dielectric 302 over bottom gate 202. According to an exemplary embodiment, carbon nanotube channel 402 comprises a carbon nanotube array (aligned or random) that is deposited onto dielectric 302. Techniques for depositing the carbon nanotube arrays can range from solution-based dispersion to substrate transfer. The aligned growth of carbon nanotubes on, e.g., quartz, substrates and the subsequent transfer of these carbon nanotubes onto a receiving substrate have been well documented and as such, these processes are not described further herein. Such transfer processing methods would work very well with the instant techniques, where the unwanted portions of the carbon nanotubes are simply etched away after the transfer. If the carbon nanotube array deposition is solution-based, the carbon nanotubes will not likely be as well-aligned, but could be patterned directly onto the gate region without the need for subsequent etch removal steps.

The density of the carbon nanotubes in each device layer determines the current capacity for that layer. For example, the carbon nanotube density in each device layer can vary from about 5 carbon nanotubes per micrometer ($\mu$m) to about 200 carbon nanotubes per $\mu$m, depending on the source of the nanotubes.

Figure 5:
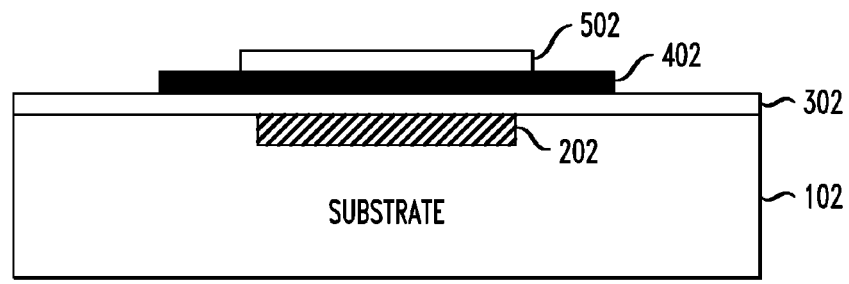
FIG. 5 is a cross-sectional diagram illustrating a second dielectric having been deposited over the carbon nanotube channel according to an embodiment of the present invention.

FIG. 5 is a cross-sectional diagram illustrating a dielectric 502 having been deposited over carbon nanotube channel 402. According to an exemplary embodiment, dielectric 502 has the same composition and is deposited in the same manner as dielectric 302, described in conjunction with the description of FIG. 3, above.

Figure 6:
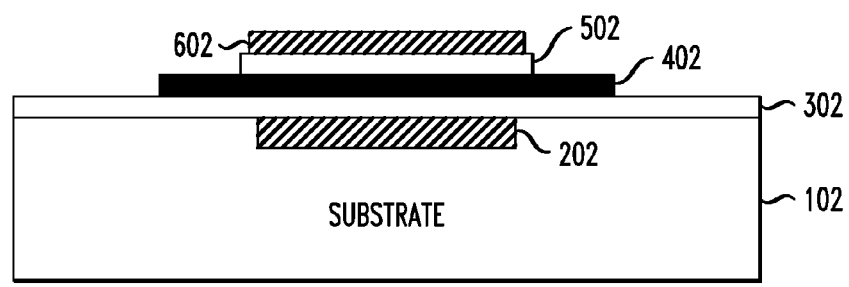
FIG. 6 is a cross-sectional diagram illustrating a top gate having been formed on the second dielectric according to an embodiment of the present invention.

FIG. 6 is a cross-sectional diagram illustrating a top gate 602 having been formed on dielectric 502. Like with bottom gate 202, as described above, top gate 602 can comprise a metal(s), such as Al, Ti and/or Pd, or alternatively top gate 602 can comprise poly-silicon doped to attain a desired work function and conductivity. Details regarding the use of a metal(s) or poly-silicon as a gate material were presented above. Whichever gate material is chosen, that gate material can be deposited on dielectric 502 and then patterned to form top gate 602. According to an exemplary embodiment, in order to ensure that dielectric 502 (and subsequent dielectrics) and top gate 602 (and subsequent gates) remain local to the stack, once dielectric 502 is deposited over carbon nanotube channel 402 a resist mask (not shown), e.g., PMMA, is patterned over dielectric 502 so as to cover the dimensions (the footprint) of the stack. An etch around the resist mask is used to remove excess dielectric material from all but the stack area. Then top gate 602 is deposited and another, second resist mask (not shown), e.g., PMMA, is patterned over top gate 602 in the same manner to cover the dimensions (the footprint) of the stack. An etch around the second resist mask is used to remove excess top gate material from all but the stack area. After each round of etching, acetone can be used to remove the respective masks.

At this point in the process, a first device layer is now complete. As highlighted above, each device layer includes a first dielectric (e.g., dielectric 302), a carbon nanotube channel (e.g., carbon nanotube channel 402) and a top gate (e.g., top gate 602) separated from the carbon nanotube channel by a second dielectric (e.g., dielectric 502). One or more additional device layers will now be fabricated on top of the first device layer, in a stack. The purpose of this configuration is to achieve a desired current in the device. In general, the greater the number of device layers in the stack the greater the current carrying capacity of the device, due to the increased number of carbon nanotube channels present. As will be described in detail below, the multiple carbon nanotube channels are connected, in parallel, to source and drain regions of the device.

Figure 7:
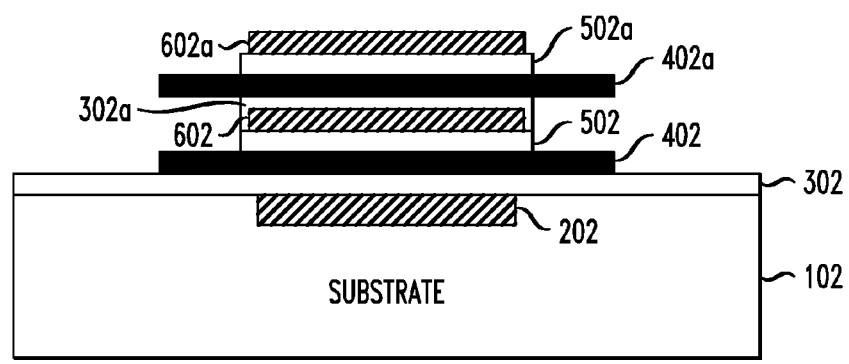
FIG. 7 is a cross-sectional diagram illustrating a second device layer having been formed on the first device layer to form a stack of device layers according to an embodiment of the present invention.

FIG. 7 is a cross-sectional diagram illustrating a second device layer having been formed on the first device layer, so as to form a stack of device layers. Like the first device layer, the second device layer includes a first dielectric (e.g., dielectric 302a), a carbon nanotube channel (e.g., carbon nanotube channel 402a) and a top gate (e.g., top gate 602a) separated from the carbon nanotube channel by a second dielectric (e.g., dielectric 502a). As described above, resist masks (not shown), e.g., PMMA, can be used in conjunction with the formation of the dielectrics (e.g., dielectrics 302a and 502a) and the top gate (e.g., top gate 602a) to ensure that the dielectrics and top gate remain local to the stack. It is notable that in the first device layer, the dielectric over the bottom gate (e.g., dielectric 302) covers the whole substrate, whereas in subsequent device layers, such as here, the first dielectric (e.g., dielectric 302a) is only in the stack. This configuration can be achieved through use of an additional lithography and etching step, e.g., through a PMMA resist mask, during the formation of the second and subsequent device layers, as described above.

As shown in the figures, the carbon nanotube channels do not need to be local to the stack. In fact, it is advantageous for the carbon nanotube channels to protrude/extend from the stack so that the source and drain contacts (formed as described below) can envelope those carbon nanotube channel extensions.

It is notable that with this configuration the top gate of a given one of the device layers in the stack also serves as a bottom gate for the device layer immediately above that given layer (i.e., the next highest layer) in the stack. Thus, by way of example only, top gate 602 (of the first device layer) also serves as a bottom gate for the second device layer. With the present device configuration, all of the bottom and top gates are interconnected to create a single gate (i.e., one common gate) of the device that modulates the carbon nanotube channel from the bottom and top, respectively, thus improving the electrostatics.

Figure 8:
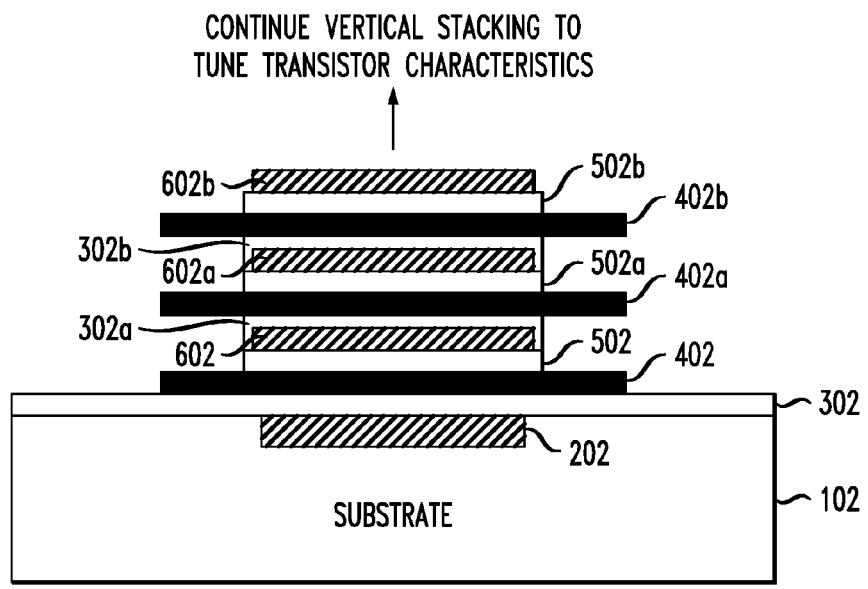
FIG. 8 is a cross-sectional diagram illustrating a third device layer having been formed on the stack according to an embodiment of the present invention.

FIG. 8 is a cross-sectional diagram illustrating a third device layer having been formed on the stack, i.e., on the second device layer, by the same process and with the same materials used to form the second device layer. Like the first and second device layers, the third device layer includes a first dielectric (e.g., dielectric 302b), a carbon nanotube channel (e.g., carbon nanotube channel 402b) and a top gate (e.g., top gate 602b) separated from the carbon nanotube channel by a second dielectric (e.g., dielectric 502b). Additional device layers (i.e., fourth, fifth device layers, etc.) can be added to the stack in the same manner (i.e., the number of device layers formed can be varied) to tune the characteristics of the device. The number of layers is determined by the density of carbon nanotubes that are being used in each device layer which, as described above, determines the current for each device layer. Thus, for device layers of a given carbon nanotube density, increasing the number of device layers increases the overall current capacity of the device. For example, if each device layer has a density of 50 carbon nanotubes for the designated device width w (see FIG. 2, described above), and each nanotube carries 20 microamps (μA) of current, then each device layer will provide 1 milliamps (mA) of current. Therefore, for a 3 mA drive current device, three device layers will be needed.

As highlighted above, the present techniques address the challenge of obtaining enough carbon nanotubes in a transistor channel to realize on-currents comparable to those in silicon complementary metal-oxide semiconductor (CMOS). A concept utilized herein is that the carbon nanotube channel material does not have to be substrate-bound, thus allowing for the present vertical integration (stacking) approach. One of the foremost advantages of this approach is that each layer of channel material (carbon nanotube array) is kept isolated from the under/overlying parallel layers, eliminating 1) any charge screening effects between layers that could hamper performance and 2) potential carbon nanotube bundling that can occur when depositing carbon nanotube arrays on top of one another. The vertical integration also provides each carbon nanotube in the transistor with a top and bottom gate, thus improving the electrostatics. Another advantage is that this vertical integration allows for smaller (scalable) footprint devices. Furthermore, this method is highly customizable (i.e., tunable), including the ability to design devices that incorporate a certain number of vertically stacked carbon nanotube layers to achieve desired on-currents, and the ability to stack enough layers to achieve currents well beyond silicon CMOS (see above). The present techniques can be implemented to produce transistor devices that are highly customized to suit a particular layout or process technology.

Figure 9:
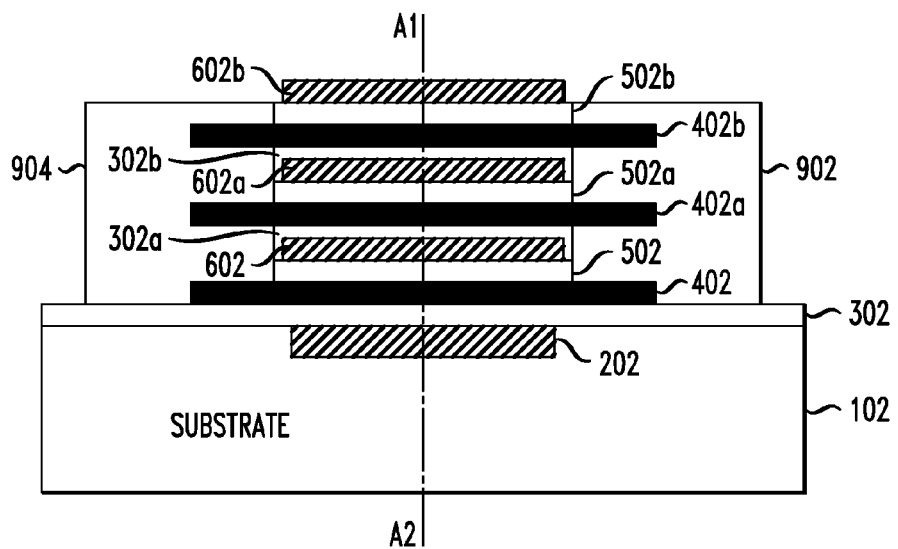
FIG. 9 is a cross-sectional diagram illustrating source and drain contacts having been formed on opposite sides of the stack according to an embodiment of the present invention.

Once the appropriate number of device layers have been fabricated, source and drain contacts are formed. FIG. 9 is a cross-sectional diagram illustrating source and drain contacts 902 and 904 having been formed on opposite sides of the stack. As highlighted above, the carbon nanotube channels preferably protrude/extend from the stack. As shown in FIG. 9, source and drain contacts 902 and 904 envelope those carbon nanotube channel extensions. Accordingly, source and drain contacts 902 and 904 interconnect the device layers in parallel. Specifically, source and drain contacts 902 and 904 interconnect the carbon nanotube channels of the various device layers in parallel. The source and drain contacts may be formed by depositing metal through a resist mask and then lifting off. A variety of other suitable methods known to those of skill in the art may be similarly employed to form the source and drain contacts.

As described above, with the present device configuration, all of the bottom and top gates are interconnected to create a single gate (i.e., one common gate) of the device that modulates the carbon nanotube channel from the bottom and top, respectively, thus improving the electrostatics. According to an exemplary embodiment, the bottom and top gates are interconnected away from the active device. See, for example, FIG. 10.

Figure 10:
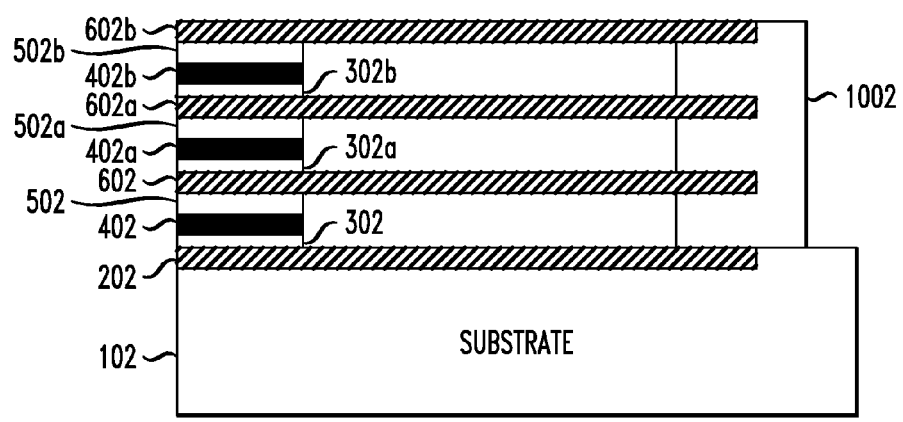
FIG. 10 is a cross-sectional diagram illustrating an exemplary configuration for interconnecting the gates in the stack according to an embodiment of the present invention.

FIG. 10 is a cross-sectional diagram illustrating an exemplary configuration for interconnecting the top and bottom gates in the stack. The depiction shown in FIG. 10 is representative of a cross-sectional cut through the device layer stack and substrate, e.g., of FIG. 9, along line A1-A2 which is perpendicular to the cross-sectional view shown in FIG. 9. As shown in FIG. 10, all of the gates 202, 602, 602a and 602b are joined (interconnected) at block 1002. According to an exemplary embodiment, block 1002 is simply a patterned block of gate material, i.e., the same gate material (metal or doped poly-silicon) as the gates. Block 1002 may be fabricated by depositing the gate material through a resist mask and then lifting off.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A transistor device, comprising:
   a substrate;
   a bottom gate embedded in the substrate with a top surface of the bottom gate being substantially coplanar with a surface of the substrate;
   a stack of device layers on the substrate over the bottom gate, wherein each of the device layers in the stack includes a first dielectric, a carbon nanotube channel on the first dielectric, a second dielectric on the carbon nanotube channel and a top gate on the second dielectric; and
   source and drain contacts that interconnect the carbon nanotube channels in parallel.

2. The device of claim 1, wherein the substrate comprises a silicon substrate covered with a layer of silicon dioxide, and wherein the bottom gate is embedded in the silicon dioxide layer.

3. The device of claim 1, wherein the top gate and the bottom gate each comprise one or more metals.

4. The device of claim 1, wherein the top gate and the bottom gate each comprise doped poly-silicon.

5. The device of claim 1, wherein the top gate of a given one of the device layers also serves as a bottom gate for a next highest one of the device layers in the stack.

6. The device of claim 1, wherein the first dielectric and the second dielectric each comprise one or more of aluminum oxide and hafnium oxide.

7. The device of claim 1, wherein the carbon nanotube channel comprises a carbon nanotube array.

8. The device of claim 7, wherein the carbon nanotube array is aligned.

9. The device of claim 7, wherein the carbon nanotube array is random.

10. The device of claim 1, wherein a number of the device layers in the stack can vary according to a desired current carrying capacity of the device.

11. A method of fabricating a transistor device, comprising the steps of:
    providing a substrate;
    forming a bottom gate embedded in the substrate with a top surface of the bottom gate being substantially coplanar with a surface of the substrate;
    forming a stack of device layers on the substrate over the bottom gate, wherein each of the device layers in the stack includes a first dielectric, a carbon nanotube channel on the first dielectric, a second dielectric on the carbon nanotube channel and a top gate on the second dielectric; and
    forming source and drain contacts that interconnect the carbon nanotube channels in parallel.

12. The method of claim 11, wherein the step of forming the bottom gate embedded in the substrate comprises the steps of:
    forming a trench in the substrate;
    filling the trench with a gate material; and
    polishing the gate material down to the surface of the substrate.

13. The method of claim 12, further comprising the step of:
    undercutting the trench.

14. The method of claim 13, wherein the trench is undercut using a wet chemical etch.

15. The method of claim 13, wherein the step of forming the stack of device layers comprises the steps of, for each device layer:
    depositing the first dielectric on a preceding device layer in the stack;
    forming the carbon nanotube channel on the first dielectric;
    depositing the second dielectric on the carbon nanotube channel; and
    forming the top gate on the second dielectric.

16. The method of claim 11, wherein the carbon nanotube channel comprises a carbon nanotube array.

17. The method of claim 16, wherein the carbon nanotube array is aligned.

18. The method of claim 16, wherein the carbon nanotube array is random.

19. The method of claim 11, further comprising the step of:
    varying a number of the device layers in the stack to achieve a desired current carrying capacity for the device.

* * * * *